United States Patent [19]
Doerr et al.

[11] Patent Number: 5,913,000
[45] Date of Patent: Jun. 15, 1999

[54] METHOD AND APPARATUS FOR GUIDING OPTICAL SIGNALS

[76] Inventors: Christopher Richard Doerr, 1000 Oaks Dr., Apt. 99, Atlantic Highlands, N.J. 07716; Martin Zirngibl, Hunterspointe 30, Middletown, N.J. 07734; Charles H. Joyner, 355 Conover Pl., Middletown, N.J. 07701

[21] Appl. No.: 08/580,951

[22] Filed: Dec. 29, 1995

[51] Int. Cl.⁶ .............................. G02B 6/26; G02B 6/42

[52] U.S. Cl. ................................................ 385/46

[58] Field of Search .................... 372/50, 102; 385/2, 385/14, 16, 40–46, 147

[56] References Cited

U.S. PATENT DOCUMENTS

| | | | |
|---|---|---|---|
| 3,902,133 | 8/1975 | Watts | 372/50 |
| 4,773,063 | 9/1988 | Hunsperger et al. | 385/14 |
| 4,799,749 | 1/1989 | Borner et al. | 385/14 |
| 5,136,671 | 8/1992 | Dragone | 385/46 |
| 5,253,314 | 10/1993 | Alferness et al. | 385/40 |
| 5,416,861 | 5/1995 | Seung Koh et al. | 385/14 |
| 5,499,256 | 3/1996 | Bischel et al. | 385/2 |
| 5,504,772 | 4/1996 | Deacon et al. | 372/102 |
| 5,544,268 | 8/1996 | Bischel et al. | 385/16 |

Primary Examiner—Akm E. Ullah

[57] ABSTRACT

A method and apparatus for guiding optical signals in a laser cavity to determine the oscillation frequency or frequencies of a laser by controlling the lengths of waveguide grating arms.

30 Claims, 4 Drawing Sheets

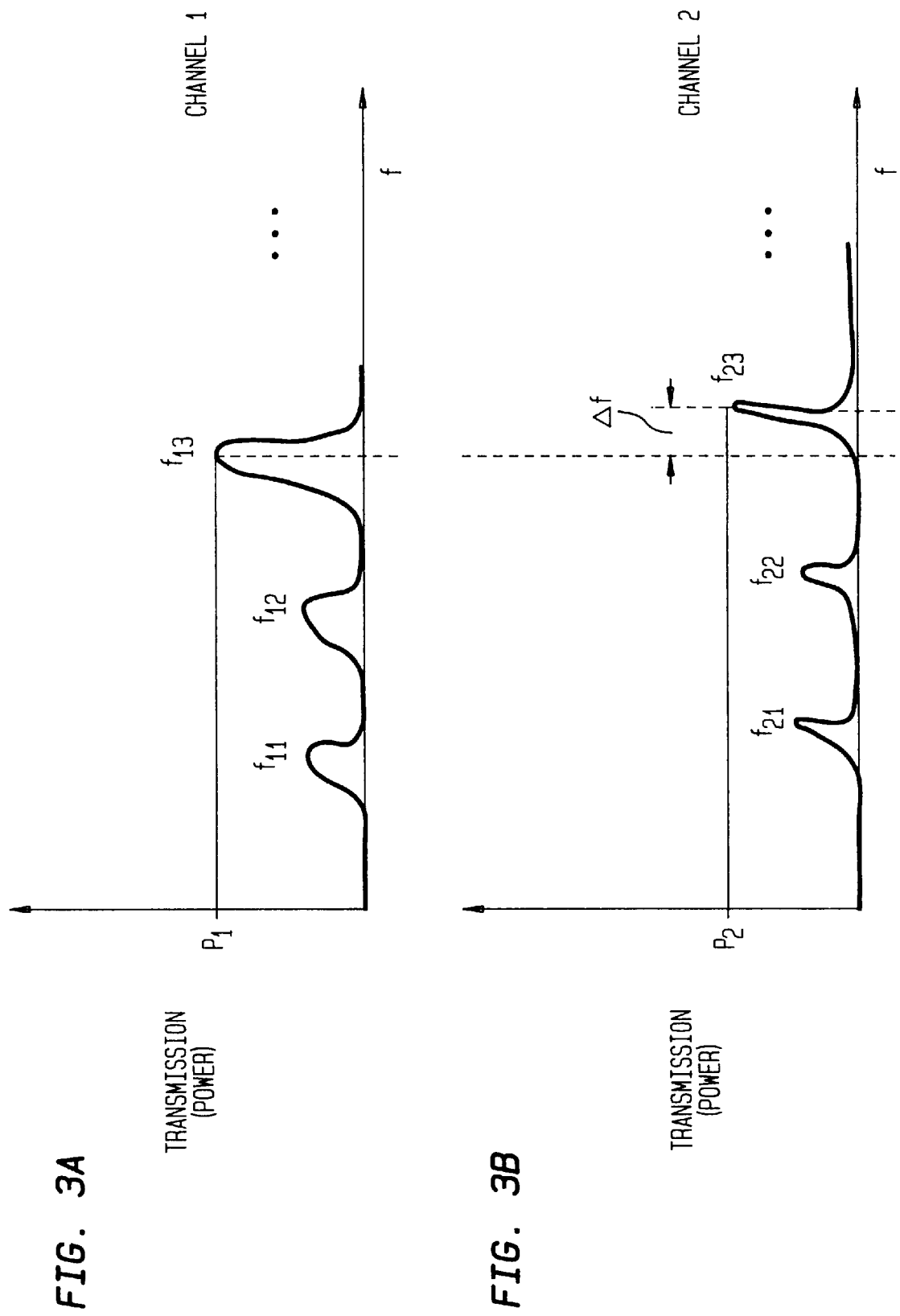

METHOD AND APPARATUS FOR GUIDING OPTICAL SIGNALS

BACKGROUND OF THE INVENTION

1. Field of the Invention

This invention relates to a method and apparatus for guiding optical signals by controlling the length of waveguides used to guide the optical signals.

2. Background of Related Art

A waveguide grating router developed by C. Dragone as disclosed in U.S. Pat. No. 5,136,671, incorporated herein by reference, is a device with $N_1$, inputs and $N_2$ outputs that consists of M grated waveguides (i.e. "arms") of varying lengths connecting two star couplers. Following the work of Dragone, and limiting the discussion to an N×N router with input channels evenly spaced in frequency and having free-spectral ranges equal to N times the channel spacing, the amplitude transmission between port p at one end of the router and port q at the other can be written as $$t_{p,q} = \sum_{m=1}^{M} P_m \exp\left(j\frac{2\pi n}{c} l_m f\right) \exp\left[j\frac{2\pi}{N}(p-q)m\right] \quad (1)$$

where f is the optical frequency, $P_m$ is the optical power in the mth arm normalized to the total power, n is the effective index of refraction of the waveguides, c is the speed of light in vacuum and $l_m$ is the length of the mth arm of a total, M, arms. In a simple router design, $l_m = m\Delta l + C$, where $\Delta l$ and C are constants. The offset value C does not affect router response and is left out in all following equations. The value $|t_{p,q}|^2$ in such a router has equal-height transmission peaks, i.e., passbands, that occur at $f=[k-(p-q)/N]c/(n\Delta l)$, where k is an integer.

The router itself acts as a filter for each input-output (p-q) combination. When one port or ports (e.g., q) are terminated with an array of N amplifiers and mirrors and a mirror and possibly an amplifier on the other side (i.e. p side), a multi-frequency laser (MFL) oscillating at N precisely spaced frequencies is obtained.

Within each channel however, a signal having a peak power level will repeatedly occur at different frequencies determined by the cavity's free-spectral range. Therefore, in some of the channels a net power gain may be nearly the same for two or more frequencies, assuming any optical amplifiers connected to the MFL router all have the same characteristics. This repetition of a peak signal within each channel results in multimode lasing of an optical laser which produces instabilities in the laser's output.

A MFL router having only one dominant passband (i.e. frequency range) or peak signal is therefore highly desirable. In addition, it is desirable to control the frequency or passband at which the peak signal occurs within each channel.

It should be noted that where it is used herein, the word "frequency" may denote a signal having a single frequency or a multitude of frequencies, i.e. a passband.

BRIEF SUMMARY OF THE INVENTION

It is therefore an object of the present invention to provide an apparatus for guiding optical signals which comprises a first waveguide coupler, a second waveguide coupler and a plurality of M grated waveguides connected to, and between, the first and second waveguide couplers for guiding signals, each grated waveguide having a length $l_m$. The length $l_m$ is given by $l_m=[m+g(m)]\Delta l_a$+constant. The value $\Delta l_a$ is a constant and its units are length. The value, m, is one waveguide out of a total M waveguides and g(m) is an arbitrary function of m, wherein g(m) is selected such that a frequency having a peak transmissivity is generated.

BRIEF DESCRIPTION OF THE DRAWINGS

The invention, together with its various features and advantages can be readily understood from the following more detailed description taken in conjunction with the accompanying drawings in which.

FIGS. 3A and 3B depict plots of frequency versus power for optical signals in a router according to an illustrative embodiment of the invention.

DETAILED DESCRIPTION OF PREFERRED EMBODIMENTS

Figure 1:
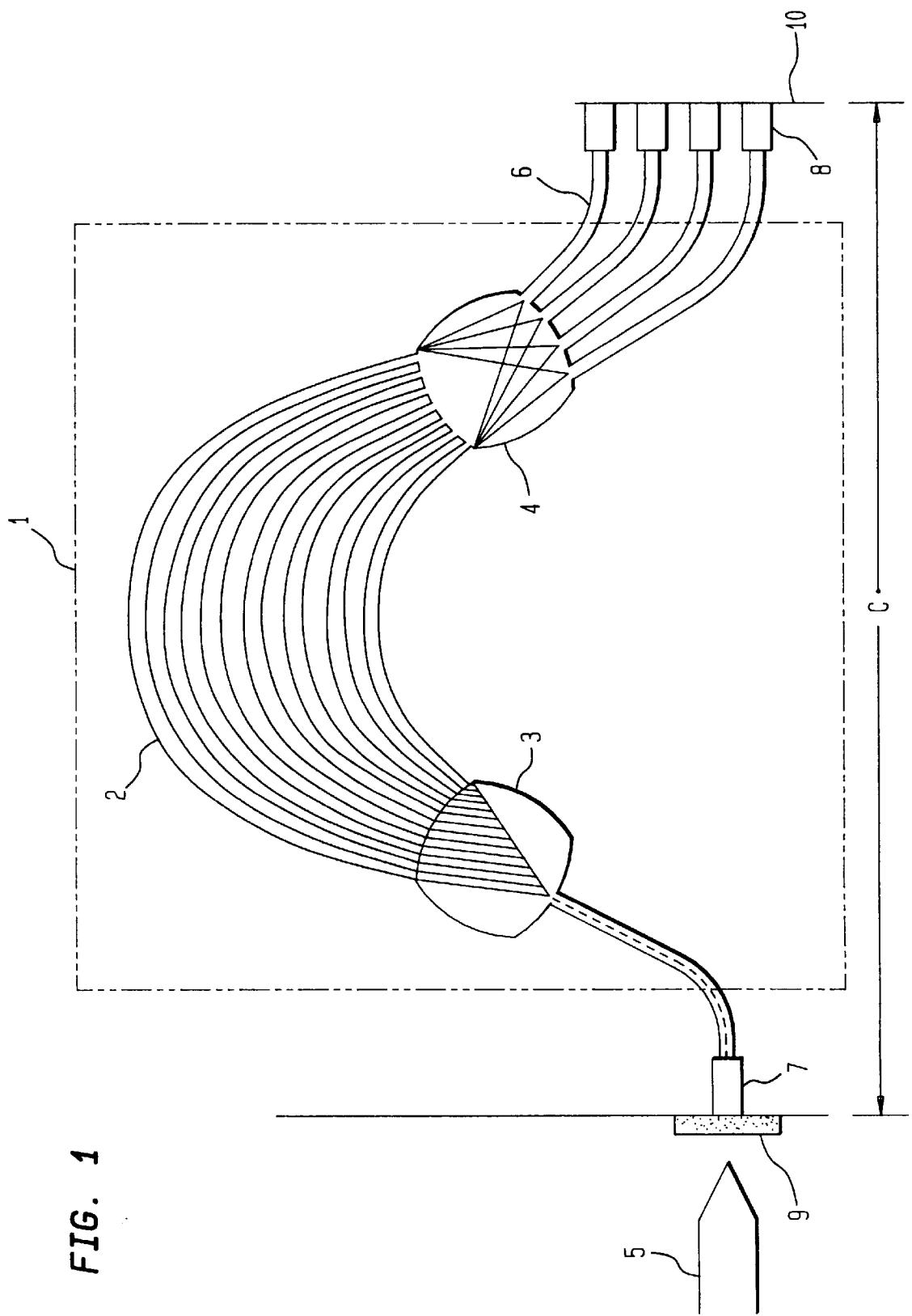
FIG. 1 depicts an apparatus for guiding optical signals according to an illustrative embodiment of the invention.

Referring to FIG. 1, there is shown a waveguide grating router 1 which comprises a total number of "M" waveguide arms 2 connected to, and between, a first waveguide coupler 3 and second waveguide coupler 4. On the left side of FIG. 1, a fiber 5 having $N_1$ channels couples $N_1$, optical signals to the first waveguide coupler 3. Optionally the $N_1$, optical signals may be amplified by a first optical amplifier 7. On the right side of FIG. 1, the second waveguide coupler 4 couples all $N_1$, optical signals into $N_2$ output fibers 6 coupled to a second optical amplifier or amplifier array 8. In one example using 8 input channels, all 8 channels or signals are input to each waveguide or arm 2, i.e. each arm 2 contains part of each signal. Depending on the lengths, $l_m$, of each arm, when each of the signals is then output from the second waveguide coupler 4, each signal may contain a number of peaks which cause multimode lasing.

It should be noted that transmission may occur to and from both waveguide couplers 3,4. Thus, the notation "first" and "second" waveguide coupler may apply to couplers 3,4 respectively, or vice-versa.

Completing the cavity "C", are first reflective mirror 9 and second reflective mirror 10 operably connected to the grated waveguides. These mirrors may be a single mirror or a plurality of mirrors, e.g., one mirror 10 for each $N_2$ output.

To remove multimode lasing, the power levels of each of the repetitive peak signals in each channel, except for one, must be reduced by, for example, adding loss to these unwanted peaks. To change the power levels, (or passband "heights") a non-uniform distribution of $l_m$ is required. Said another way, the length of a first arm $l_1$, must vary from the length of a second arm, $l_2$, by a first amount, and the length of the second arm $l_2$ must vary from the length of a third arm $l_3$, by a second amount where the first and second amounts are not equal to each other, i.e. they are non-uniform. Using non-uniformities to modulate a filter response has been applied to devices such as corrugated optical waveguides, distributed feedback lasers, weighted couplers, and beam-steerers. However, applying such a concept to an N×N router (i.e., $N_1 \times N_2$) is a unique feature of the present invention.

In order to control passband heights, the present invention controls only $l_m$ and requires that $l_m < l_{m+1} - \epsilon$, where $\epsilon > 0$. In practice, $l_m$ is equal to $(m+\alpha_m) \Delta l_t$. The value $\alpha_m$ is the deviation from a non-chirped "test" grating.

Because we are only interested in the peak amplitude (i.e. power) of a signal over a given passband and using $l_m = m\Delta l_t$, equation (1) can be reduced to $$t_{p,qenv}(\Delta l_t) = \sum_{m=1}^{M} P_m \exp\left(j\frac{2\pi n}{c}\alpha_m \Delta l_t f\right). \quad (2)$$

An envelope of passband peaks can be found by taking the largest magnitude of $t_{p,q\,env}(\Delta l_t)$ for all $\Delta l_t$ at each frequency (or wavelength), f.

For example, an embodiment of the invention separates each of the arms 2 into two separate gratings with slightly different periods. Light passing through the two gratings will add coherently over certain frequency ranges. In such an embodiment $l_m = m\Delta l_a + (M/2-m) \Delta l_b$ for m=1, . . ., M/2, and $l_m = m\Delta l_a + (m-M/2) \Delta l_b$ for m=M/2+1, . . .,M, where $\Delta l_a$ and $\Delta l_b$ are constants.

Using an envelope formalism, if $P_m = 1/M$ for all m (to simplify the calculation) then $$T_{p,qenv}(\Delta l_a) = |t_{p,qenv}(\Delta l_a)|^2 = \frac{4}{M^2}\cot^2\left(\pi\frac{n}{c}\Delta l_b f\right)\sin^2\left(\frac{M}{2}\pi\frac{n}{c}\Delta l_b f\right) \quad (3)$$

and $$T_{p,qenv}(\Delta l_a \pm \Delta l_b) = \frac{1}{4} + \frac{1}{M^2}\frac{\sin^2\left(M\pi\frac{n}{c}\Delta l_b f\right)}{\sin^2\left(2\pi\frac{n}{c}\Delta l_b f\right)} + \frac{1}{M}\frac{\sin\left(M\pi\frac{n}{c}\Delta l_b f\right)\cos\left[(-2\pm M)\pi\frac{n}{c}\Delta l_b f\right]}{\sin\left(2\pi\frac{n}{c}\Delta l_b f\right)} \quad (4)$$

If Equation (4) was plotted it may be seen that the maximum $T_{p,q\,env}(\Delta l_t)$ at each frequency, f, gives a passband envelope. From envelope plots made from Equation (4) it may also be seen that inside an envelope peak the passbands are primarily determined by $\Delta l_a$ (e.g., the channel spacing under the envelope is $c/(Nn\Delta l_a)$), while outside the envelope they are primarily determined by $\Delta l_a \pm \Delta l_b$. The location of an envelope peak, its width and the envelope periodicity are set by adjusting $\Delta l_b$, while channel spacing and positioning under the envelope are set by adjusting $\Delta l_a$. The values $\Delta l_a$ and $\Delta l_b$ have units of length. Control of channel positioning is useful because, in a router, losses increase with an increasing $|p-q|$ (the outermost channels have a higher loss than the innermost channels). Thus, the channels at the peak of the envelope can be designed to be the largest $|p-q|$ channels, causing a rough equalization of the transmission of the channels. For simplicity, however, this increase in loss for larger $|p-q|$ channels is not included in Equations (1–4).

An illustrative embodiment of the invention is given by $$l_m = [m+g(m)]\Delta l_a + \text{constant} \quad (5)$$

It should be noted that g(m), an arbitrary, non-linear function of m, may vary, or may be the same in each embodiment of the invention described herein.

The value g(m) may, generally, equal a constant, $\gamma$, multiplied by $(1-2m/M)$ for m=1,. . .,M/2 (Equation (6)) and, $\gamma$, multiplied by $(2m/M-1)$ for m=M/2+1,. . .,M (Equation (7)). The constant $\gamma$ adjusts a width of an envelope under which are passbands or frequencies having the highest transmissivity (power) for all combinations of the first and second waveguide couplers 3,4. Said another way, given a combination of first and second waveguide couplers, g(m) can be selected to generate only one passband or frequency at a peak power level or transmissivity between the first and second couplers 3,4. This one passband of frequencies or frequency may then be used to oscillate a laser or lasers. It should be noted that the value $\gamma$ used in Equations (6) and (7) may be different or may be the same. The value $\Delta l_a$ determines the channel spacing and channel alignment of the envelope and g(m) determines the envelope shape.

Another illustrative embodiment of the invention derived from equation (5) is given by:

$$l_m = m\Delta l_a + \text{round}\left[g(m)\Delta l_a\frac{nf_c}{c}\right]\frac{c}{nf_c} + \text{constant} \quad (8)$$

where g(m) as before is an arbitrary, non-linear function of m with a small average $g(m+1)-g(m)$, "round" is a function that rounds its argument to the nearest integer, and $f_c$ is a frequency having a peak transmissivity. An advantage of this embodiment of the invention is that the passband envelope width and location can be independently controlled.

One illustrative embodiment using Equation (8) is a two-grating design, where g(m) equals $\gamma 2grat(1-2m/M)$ for m=1,. . .,M/2, and $\gamma 2grat(2m/M-1)$ for m=M/2+1,. . .,M where $\gamma 2grat$ is a constant that adjusts the envelope width. In one embodiment of the present invention $\gamma 2grat$ is equal to $M\Delta l_b/(2\Delta l_a) \approx 1$.

Another illustrative embodiment of the invention utilizing Equation (8) is an "M"-grating design, in which $g(m+1)-g(m)$ changes linearly. In this design, g(m) equals $\gamma Mgrat[m(m+1)/M-m]$, where like, $\gamma 2grat$, $\gamma Mgrat$ is a constant that adjusts envelope width.

Figure 2A:
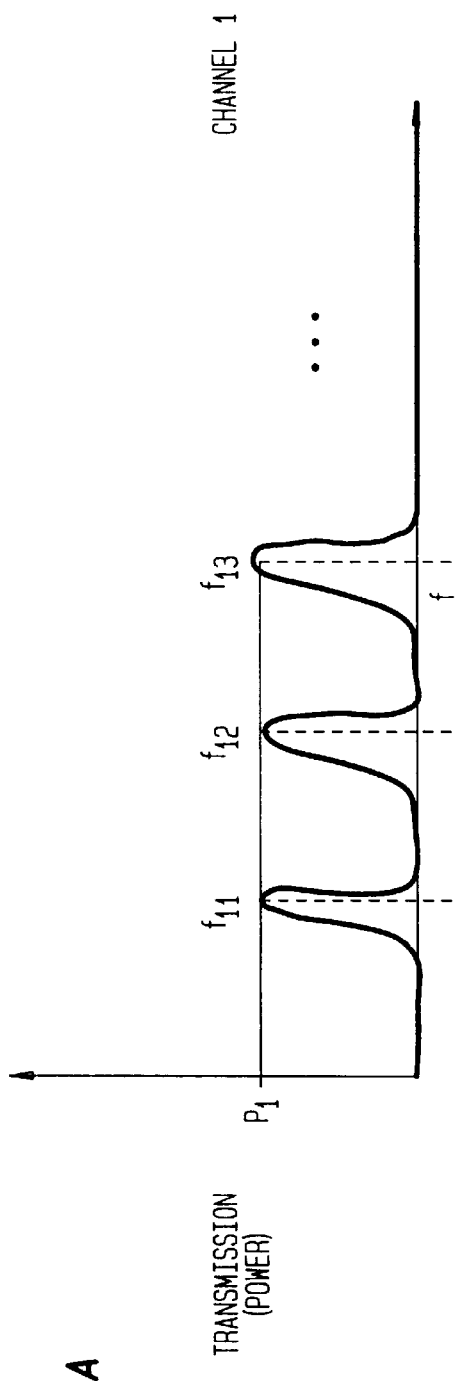
FIGS. 2A and 2B depict plots of frequency versus power for optical signals in a prior art router.
Figure 2B:
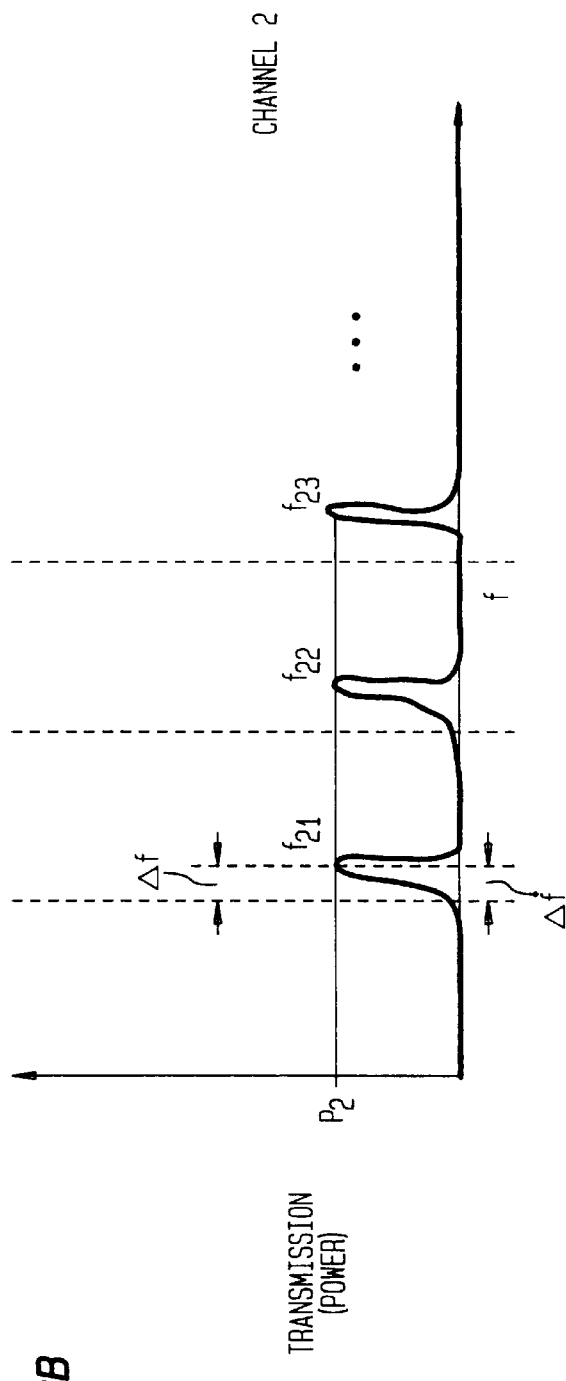

FIGS. 2A and 2B show plots of frequency versus transmission (power) for a prior art router.

FIGS. 3A and 3B show plots of frequency versus transmission (power) for a two grating router according to an illustrative embodiment of the invention.

In FIG. 2A, a signal in channel 1 is depicted. In FIG. 2B, a signal in channel 2 is depicted. Within channel 1 it can be seen there is a number of frequencies $f_{11}$, $f_{12}$, $f_{13}$. . ., or passbands all at the same relative height or power, $p_1$. In channel 2, the frequencies $f_{21}$, $f_{22}$, $f_{23}$,. . ., are all at the same relative height or power, $p_2$ and are shifted by amounts $\Delta f$ from the frequencies $f_{11}$, $f_{12}$ and $f_{13}$. . . in channel 1.

Using a two-grating design, the signals in channels 1 and 2 are changed to those shown in FIGS. 3A and 3B where all but one frequency or passband is reduced in power, i.e. only one passband or frequency remains at $p_1$ and $p_2$, respectively.

Figure 4:
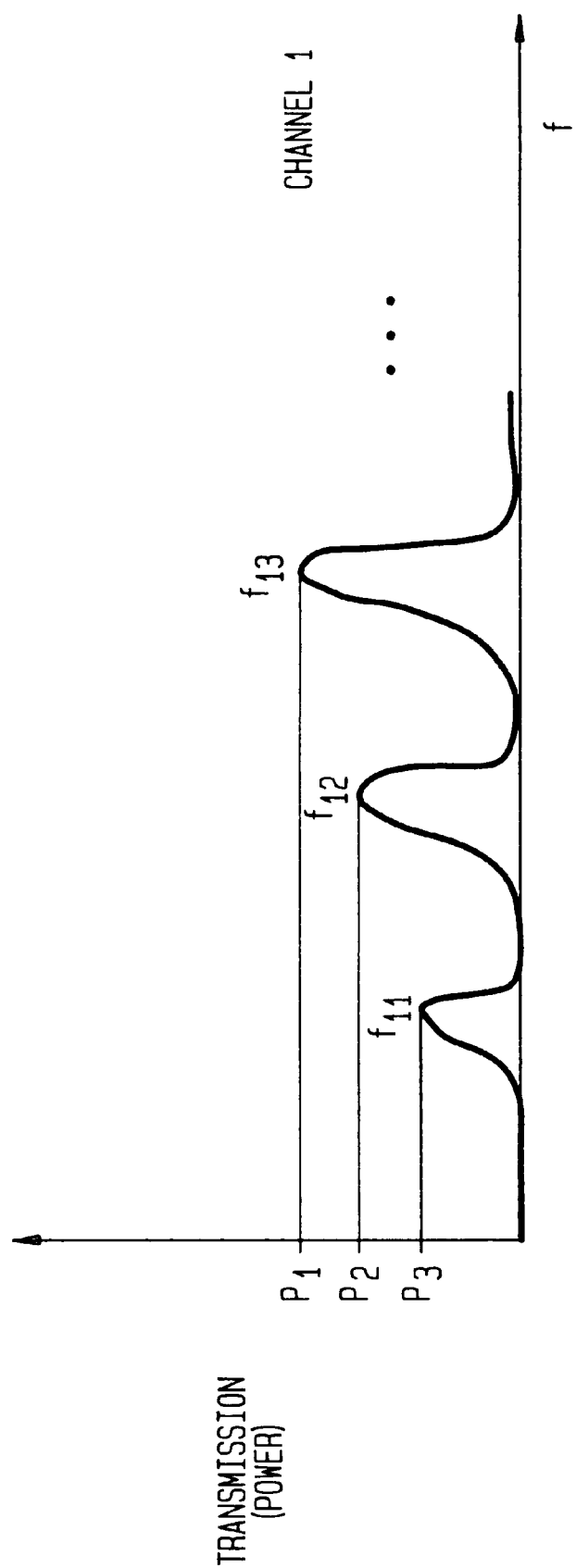
FIG. 4 depicts a plot of frequency versus power of an optical signal in a router according to another embodiment of the invention.

FIG. 4 shows the signal in channel 1 using an M-grating design. Again, only one maximum peak is generated. However, the power in every other peak is reduced by a gradient, that is $p_1 > p_2 > p_3$.

A comparison of the two-grating design versus the M-grating design suggests that the two-grating design maintains a good extinction ratio for more channels than the M-grating design.

According to an illustrative embodiment of the invention a two-grating router for guiding optical signals may be fabricated in InP using buried rib waveguides with N=10 (channels), M=36 (arms) and a channel spacing of 100 GHz. With such a structure, seven out of the 10 channels may have extinction ratios less than −3 dB, 2(q=2, 10) may have extinction ratios of −2 dB and 1(q=1) may have nearly equal passbands. These extinction ratios are about 1 to 2 dB worse than expected due to, it is believed, phase errors. Phase errors may arise from path length errors, material index variations or variations in waveguide width. The resulting envelope and passband positions may be repeatable to approximately ±0.5 nm from chip-to-chip (whether on the same wafer or on different wafers).

It is to be understood that the above-described embodiments are merely illustrative of the many possible embodiments which can be devised to represent the application of the principles of the invention. Numerous and varied other arrangements can be devised in accordance with these principles by those skilled in the art without departing from the spirit and scope of the invention as set forth herein and in the following claims.

What is claimed is:

1. An apparatus for guiding optical signals comprising:
   a first waveguide coupler,
   a second waveguide coupler; and
   a plurality of M grated waveguides connected to, and between, the first and second waveguide couplers for guiding signals, each grated waveguide having a length $l_m$ given by $$l_m = [m+g(m)]\Delta l_a + \text{constant}$$

where:
   $\Delta l_a$ is a constant and its units are length;
   m is one waveguide out of the total M waveguides; and
   g(m) is an arbitrary, non-linear function of m;
   wherein g(m) is selected such that a frequency having a peak transmissivity between the first and second couplers is generated.

2. The apparatus as in claim 1 wherein $l_m$ is given by $$l_m = m\Delta l_a + \text{round}\left[g(m)\Delta l_a \frac{nf_c}{c}\right]\frac{c}{nf_c} + \text{constant}$$

where:
   $f_c$ is a frequency having a peak transmissivity;
   n is the effective index of refraction in the waveguides;
   c is the speed of light in vacuum; and
   "round" is a function that rounds its argument to the nearest integer.

3. The apparatus as in claim 2, wherein g(m) equals γ2grat (1−2m/M) for m=1,. . .,M/2, and γ2grat(2m/M−1) for m=M/2+1,. . .,M),
   where:
   γ2grat is a constant that adjusts an envelope width.

4. The apparatus as in claim 2, wherein g(m) equals γMgrat[m(m+1)/M−m],
   where:
   γMgrat is a constant that adjusts envelope width.

5. The apparatus as in claim 1, further comprising a first amplifier connected to the first waveguide coupler.

6. The apparatus as in claim 1, further comprising a second amplifier connected to the second waveguide coupler.

7. The apparatus as in claim 6, wherein the second amplifier is an array of amplifiers.

8. The apparatus in claim 1, wherein the first and second waveguide couplers are star couplers.

9. The apparatus as in claim 5, wherein the first amplifier is an optical amplifier.

10. The apparatus as in claim 6, wherein the second amplifier is an optical amplifier.

11. The apparatus as in claim 7, wherein the second amplifier comprises an array of optical amplifiers.

12. The apparatus as in claim 1 further comprising a first reflective mirror operably connected to the grated waveguides.

13. The apparatus as in claim 6 further comprising a second reflective mirror operably connected to the grated waveguides.

14. The apparatus as in claim 13 wherein the second reflective mirror comprises a plurality of reflective mirrors.

15. An apparatus for guiding optical signals, comprising:
    a first waveguide coupler;
    a second waveguide coupler; and
    a plurality of M grated waveguides connected to, and between, the first and second waveguide couplers, the apparatus having a maximum amplitude transmission given by;

$$T_{p,qenv}(\Delta l_a) = |t_{p,qenv}(\Delta l_a)|^2 = \frac{4}{M^2}\cot^2\left(\pi\frac{n}{c}\Delta l_b f\right)\sin^2\left(\frac{M}{2}\pi\frac{n}{c}\Delta l_b f\right)$$

where:
    $\Delta l_a$ and $\Delta l_b$ are constants and their units are length;
    m is one waveguide out of a total M waveguides;
    n is the effective index of refraction in the waveguides;
    c is the speed of light in vacuum; and
    f is a passband frequency.

16. A method for guiding optical signals, comprising:
    coupling signals into a number of M grated waveguides using a first waveguide coupler, each waveguide having a length $l_m$ given by $$l_m = [m+g(m)]\Delta l_a + \text{constant}$$

where:
    $\Delta l_a$ is a constant and its units are length;
    m is one waveguide out of the total M waveguides; and
    g(m) is an arbitrary, non-linear function of m;
    coupling the number of M waveguides into a second waveguide coupler; and
    wherein g(m) is selected such that a frequency having a peak transmissivity between the first and second couplers is generated.

17. The method as in claim 16 wherein $l_m$ is given by:

$$l_m = m\Delta l_a + \text{round}\left[g(m)\Delta l_a \frac{nf_c}{c}\right]\frac{c}{nf_c}$$

where:
    $f_c$ is a frequency having a peak transmissivity;
    n is the effective index of refraction in the waveguides;
    c is the speed of light in vacuum; and
    "round" is a function that rounds its argument to the nearest integer.

18. The method as in claim 17, wherein g(m) equals γ2grat (1−2m/M) for m=1,. . .,M/2, and γ2grat(2m/M−1) for m=M/2+1,. . .,M),
    where:
    γ2grat is a constant that adjusts an envelope width.

19. The method as in claim 17, wherein g(m) equals γMgrat[m(m+1)/M−m]
    where:

γMgrat is a constant that adjusts envelope width.

20. The method as in claim 16, further comprising amplifying the signals coupled to the first waveguide coupler.

21. The method as in claim 16, further comprising amplifying signals from the second waveguide coupler.

22. The method as in claim 21, wherein said amplifying comprises amplifying said signals using an array of amplifiers.

23. The method as in claim 16, wherein the first and second waveguide couplers are star couplers.

24. The method as in claim 20, wherein the signals coupled to the first waveguide coupler are optically amplified.

25. The method as in claim 21, wherein the signals from the second waveguide coupler are optically amplified.

26. The method as in claim 22, wherein said array comprises an array of optical amplifiers.

27. The method as in claim 16, wherein said waveguides are operably connected to a first reflective mirror.

28. The method as in claim 16, wherein said waveguides are operably connected to a second reflective mirror.

29. The method as in claim 28, wherein the second reflective mirror comprises a plurality of reflective mirrors.

30. A method for guiding optical signals, comprising:
coupling signals into a number of M grated waveguides using a first waveguide coupler; and
coupling the number of M waveguides into a second waveguide coupler, wherein a maximum amplitude transmission is given by:

$$T_{p,qenv}(\Delta l_a) = |t_{p,qenv}(\Delta l_a)|^2 = \frac{4}{M^2}\cot^2\left(\pi\frac{n}{c}\Delta l_b f\right)\sin^2\left(\frac{M}{2}\pi\frac{n}{c}\Delta l_b f\right)$$

where:
$\Delta l_a$ and $\Delta l_b$ are constants;
m is one waveguide out of the total M waveguides;
n is the effective index of refraction in the waveguides;
c is the speed of light in a vacuum; and
f is a passband frequency.

* * * * *